US012051867B2

(12) United States Patent
Liu et al.

(10) Patent No.: US 12,051,867 B2
(45) Date of Patent: Jul. 30, 2024

(54) CARD EDGE CONNECTOR WITH A LOCKING SYSTEM

(71) Applicant: Amphenol Commercial Products (Chengdu) Co., Ltd., Chengdu (CN)

(72) Inventors: Bing Liu, Chengdu (CN); Tao Zeng, Chengdu (CN); Ronald Nico Adriaan Daamen, Vught (NL); Thierry Goossens, Herdersem (BE)

(73) Assignee: Amphenol Commercial Products (Chengdu) Co., Ltd., Chengdu (CN)

( * ) Notice: Subject to any disclaimer, the term of this patent is extended or adjusted under 35 U.S.C. 154(b) by 25 days.

(21) Appl. No.: 17/540,062

(22) Filed: Dec. 1, 2021

(65) Prior Publication Data

US 2022/0181811 A1    Jun. 9, 2022

(30) Foreign Application Priority Data

Dec. 4, 2020    (CN) .......................... 202011408724.1

(51) Int. Cl.
*H01R 12/72* (2011.01)
*H01R 12/70* (2011.01)

(52) U.S. Cl.
CPC ....... *H01R 12/724* (2013.01); *H01R 12/7023* (2013.01); *H01R 12/725* (2013.01)

(58) Field of Classification Search
CPC .................. H01R 12/724; H01R 12/7023; H01R 12/725; H01R 12/721; H01R 13/6271
See application file for complete search history.

(56) References Cited

U.S. PATENT DOCUMENTS

| 3,573,706 A | 4/1971 | Haberlen |
| 3,970,353 A | 7/1976 | Kaufman |

(Continued)

FOREIGN PATENT DOCUMENTS

| CN | 1175101 A | 3/1998 |
| CN | 202633554 U | 12/2012 |

(Continued)

OTHER PUBLICATIONS

International Search Report and Written Opinion mailed Nov. 29, 2021 for International Application No. PCT/CN2021/114671.

(Continued)

*Primary Examiner* — Renee S Luebke
*Assistant Examiner* — Paul D Baillargeon
(74) *Attorney, Agent, or Firm* — Wolf, Greenfield & Sacks, P.C.

(57) ABSTRACT

A card edge connector with a locking system, which may include a locking member integrally formed with a connector housing. The locking member may deflect upon insertion of an edge of a board into the connector and spring back to engage an opening in the board. The locking member and the opening in the board may have perimeters that are rounded, allowing relative rotation about an axis through the opening even though the board is locked within the connector. Such a configuration may provide a simple and secure locking system. Such a configuration may support connecting two parallel boards, each with a card edge connector, through a riser board with opposite ends inserted into the two connectors. Relative rotation of the board with respect to the connectors enables skew, in a direction parallel to the surfaces of the parallel boards, while securing each of those boards to the riser board.

19 Claims, 8 Drawing Sheets

(56) References Cited

U.S. PATENT DOCUMENTS

| | | | |
|---|---|---|---|
| 4,487,468 | A | 12/1984 | Fedder et al. |
| 4,521,065 | A | 6/1985 | Nestor et al. |
| 4,931,021 | A | 6/1990 | Mohan |
| 5,035,641 | A | 7/1991 | Van-Santbrink et al. |
| 5,110,298 | A | 5/1992 | Dorinski et al. |
| 5,393,247 | A | 2/1995 | DiOrazio et al. |
| 5,411,402 | A | 5/1995 | Bethurum |
| 5,581,877 | A | 12/1996 | Woychik et al. |
| 5,629,839 | A | 5/1997 | Woychik |
| 5,754,411 | A | 5/1998 | Woychik |
| 5,777,855 | A | 7/1998 | Yokajty |
| 5,954,536 | A | 9/1999 | Fuerst et al. |
| 6,062,911 | A | 5/2000 | Davis et al. |
| 6,102,734 | A | 8/2000 | Kuo |
| 6,135,781 | A | 10/2000 | Pope et al. |
| 6,139,357 | A | 10/2000 | Shih |
| 6,246,016 | B1 | 6/2001 | Roessler et al. |
| 6,496,384 | B1 | 12/2002 | Morales et al. |
| 6,599,142 | B2 | 7/2003 | Bu |
| 6,623,292 | B1 | 9/2003 | Holler et al. |
| 6,629,855 | B1 | 10/2003 | North et al. |
| 6,638,105 | B1 | 10/2003 | Wu |
| 6,648,682 | B1 | 11/2003 | Wu |
| 6,672,888 | B1 | 1/2004 | Ku |
| 6,695,630 | B1 | 2/2004 | Ku |
| 6,709,283 | B2 | 3/2004 | Lai |
| 6,746,257 | B2 | 6/2004 | Billman |
| 6,796,831 | B1 | 9/2004 | Yasufuku et al. |
| 6,802,732 | B1 | 10/2004 | Bu et al. |
| 6,824,407 | B1 | 11/2004 | Zhao et al. |
| 6,848,927 | B2 | 2/2005 | Shirai |
| 6,884,100 | B1 | 4/2005 | Hsiao |
| 7,008,250 | B2 | 3/2006 | Shuey et al. |
| 7,029,307 | B1 | 4/2006 | Ling et al. |
| 7,074,067 | B2 | 7/2006 | Yang et al. |
| 7,121,862 | B2 | 10/2006 | Tang et al. |
| 7,182,610 | B2 | 2/2007 | Lin |
| 7,244,134 | B2 | 7/2007 | Ju |
| 7,371,103 | B2 | 5/2008 | McGrath et al. |
| 7,374,441 | B2 | 5/2008 | Rubenstein |
| 7,379,021 | B2 | 5/2008 | Lee |
| 7,462,049 | B2 | 12/2008 | Chen et al. |
| 7,484,978 | B1 | 2/2009 | Gao |
| 7,500,863 | B2 | 3/2009 | Ringler et al. |
| 7,578,689 | B2 | 8/2009 | Guan et al. |
| 7,607,949 | B2 | 10/2009 | Hsu |
| 7,618,270 | B2 | 11/2009 | Scherer et al. |
| 7,637,783 | B2 | 12/2009 | Sasaoka et al. |
| 7,658,628 | B2 | 2/2010 | Guan et al. |
| 7,661,974 | B1 | 2/2010 | Sun |
| 7,677,907 | B2 | 3/2010 | Guan et al. |
| 7,710,740 | B2 | 5/2010 | Liu |
| 7,716,821 | B2 | 5/2010 | Yan et al. |
| 7,731,541 | B1 | 6/2010 | Lee et al. |
| 7,864,544 | B2 | 1/2011 | Smith et al. |
| 7,866,995 | B1 | 1/2011 | Kudo |
| 7,876,576 | B2 | 1/2011 | Mills et al. |
| 7,892,006 | B2 | 2/2011 | Guan et al. |
| 7,922,506 | B1 | 4/2011 | Harlan et al. |
| 7,938,658 | B1 | 5/2011 | Zeng et al. |
| 7,972,171 | B2 | 7/2011 | Teh |
| 7,985,086 | B1 | 7/2011 | Sun |
| 8,025,507 | B2 * | 9/2011 | Kim .................. H01R 12/7064 |
| | | | 439/79 |
| 8,075,330 | B1 | 12/2011 | Deng et al. |
| 8,087,950 | B1 | 1/2012 | Deng et al. |
| 8,113,863 | B2 | 2/2012 | Vrenna et al. |
| 8,142,207 | B1 | 3/2012 | Ljubijankic et al. |
| 8,157,576 | B2 | 4/2012 | Fu et al. |
| 8,169,378 | B2 | 5/2012 | Barson et al. |
| 8,187,031 | B2 | 5/2012 | Li et al. |
| 8,254,123 | B2 | 8/2012 | Sun |
| 8,272,897 | B2 | 9/2012 | Lin |
| 8,277,235 | B2 | 10/2012 | Lu |
| 8,328,567 | B1 | 12/2012 | Yang |
| 8,403,689 | B2 | 3/2013 | Li et al. |
| 8,422,242 | B2 | 4/2013 | Lin |
| 8,482,932 | B2 | 7/2013 | Tian et al. |
| 8,517,746 | B2 | 8/2013 | Manickam |
| 8,535,077 | B2 | 9/2013 | Shen et al. |
| 8,550,836 | B2 | 10/2013 | Ma et al. |
| 8,559,187 | B2 | 10/2013 | Peng et al. |
| 8,585,417 | B2 | 11/2013 | Chien |
| 8,654,031 | B2 | 2/2014 | Livingston et al. |
| 8,665,587 | B2 | 3/2014 | Peng et al. |
| 8,721,350 | B2 * | 5/2014 | Liu ........................ H01R 12/73 |
| | | | 439/74 |
| 8,771,001 | B2 | 7/2014 | Li et al. |
| 8,834,190 | B2 * | 9/2014 | Ngo .................... H01R 12/7023 |
| | | | 439/328 |
| 8,926,348 | B2 | 1/2015 | Ma |
| 8,951,068 | B2 | 2/2015 | Tai |
| 8,979,561 | B2 | 3/2015 | Kerrigan et al. |
| 9,095,069 | B2 | 7/2015 | Stefanoff et al. |
| 9,166,317 | B2 | 10/2015 | Briant et al. |
| 9,325,090 | B2 | 4/2016 | Shen et al. |
| 9,370,101 | B2 | 6/2016 | Ishihara et al. |
| 9,426,889 | B2 | 8/2016 | Liu et al. |
| 9,431,734 | B2 | 8/2016 | Guo et al. |
| 9,685,723 | B2 | 6/2017 | Kee Mew |
| 9,780,471 | B2 | 10/2017 | Van Rijswijk |
| 9,887,485 | B2 | 2/2018 | Lambie et al. |
| 10,103,476 | B1 | 10/2018 | Qiu et al. |
| 10,135,165 | B2 | 11/2018 | Zuo |
| 10,224,653 | B2 | 3/2019 | Niu et al. |
| 10,461,467 | B2 * | 10/2019 | Eppley .................. H01R 12/721 |
| 10,741,944 | B2 | 8/2020 | Long |
| 10,855,020 | B1 | 12/2020 | Phillips et al. |
| 10,916,894 | B2 | 2/2021 | Kirk et al. |
| 11,374,340 | B2 | 6/2022 | Tang |
| 11,545,769 | B2 * | 1/2023 | Comerci ............ H01R 12/7023 |
| 11,637,391 | B2 | 4/2023 | Guo et al. |
| 11,710,923 | B2 | 7/2023 | Hu et al. |
| 11,817,639 | B2 | 11/2023 | Yi et al. |
| 2002/0071259 | A1 | 6/2002 | Roos |
| 2003/0236006 | A1 | 12/2003 | Yamashita |
| 2004/0214466 | A1 | 10/2004 | Lin |
| 2004/0248444 | A1 | 12/2004 | Zhao et al. |
| 2006/0128174 | A1 | 6/2006 | Jang et al. |
| 2007/0010121 | A1 | 1/2007 | Haneishi |
| 2007/0032117 | A1 | 2/2007 | Huang et al. |
| 2007/0096995 | A1 | 5/2007 | Lee |
| 2007/0275587 | A1 | 11/2007 | Chang et al. |
| 2008/0090440 | A1 | 4/2008 | Beaman et al. |
| 2009/0017666 | A1 | 1/2009 | Lim et al. |
| 2009/0023332 | A1 | 1/2009 | Ringler et al. |
| 2009/0035978 | A1 | 2/2009 | Calhoun et al. |
| 2009/0077293 | A1 | 3/2009 | Kerrigan et al. |
| 2010/0022114 | A1 | 1/2010 | Chiu |
| 2010/0075538 | A1 | 3/2010 | Ohshida |
| 2010/0167570 | A1 | 7/2010 | Yang et al. |
| 2010/0202119 | A1 | 8/2010 | Nagami et al. |
| 2011/0021080 | A1 | 1/2011 | Kamiya et al. |
| 2011/0045681 | A1 | 2/2011 | Tsai |
| 2011/0065297 | A1 | 3/2011 | Guan et al. |
| 2011/0067237 | A1 | 3/2011 | Cohen et al. |
| 2011/0076868 | A1 | 3/2011 | Yao et al. |
| 2011/0081797 | A1 | 4/2011 | Chang |
| 2011/0136388 | A1 | 6/2011 | Fu et al. |
| 2011/0149543 | A1 | 6/2011 | Kamoi et al. |
| 2011/0237101 | A1 | 9/2011 | Yang |
| 2011/0275238 | A1 | 11/2011 | Iijima et al. |
| 2011/0305852 | A1 | 12/2011 | Sugaya |
| 2012/0149223 | A1 | 6/2012 | Feldman et al. |
| 2012/0156912 | A1 | 6/2012 | Shen et al. |
| 2012/0178274 | A1 | 7/2012 | Manickam |
| 2012/0178276 | A1 | 7/2012 | Lee |
| 2012/0202387 | A1 | 8/2012 | McNamara |
| 2012/0322287 | A1 | 12/2012 | Lu |
| 2013/0078825 | A1 | 3/2013 | Wain |
| 2013/0280926 | A1 | 10/2013 | Ono |
| 2013/0288504 | A1 | 10/2013 | Sass et al. |
| 2014/0099815 | A1 | 4/2014 | Foster, Sr. et al. |
| 2014/0179167 | A1 | 6/2014 | Long et al. |

(56) References Cited

U.S. PATENT DOCUMENTS

| | | |
|---|---|---|
| 2014/0301052 A1 | 10/2014 | Chen |
| 2014/0363994 A1 | 12/2014 | Li et al. |
| 2014/0364000 A1 | 12/2014 | Tang et al. |
| 2015/0144383 A1 | 5/2015 | Goodwin |
| 2015/0163944 A1 | 6/2015 | Goodwin et al. |
| 2015/0236437 A1 | 8/2015 | Briant et al. |
| 2015/0318627 A1 | 11/2015 | Berry, Jr. et al. |
| 2015/0319861 A1 | 11/2015 | Bandhu et al. |
| 2016/0013588 A1 | 1/2016 | Yang et al. |
| 2016/0013589 A1 | 1/2016 | Fu et al. |
| 2016/0020539 A1 | 1/2016 | Li et al. |
| 2016/0020540 A1 | 1/2016 | Shen et al. |
| 2016/0043487 A1 | 2/2016 | Li et al. |
| 2016/0118736 A1 | 4/2016 | Hoyack et al. |
| 2016/0190724 A1 | 6/2016 | Mito |
| 2016/0336667 A1 | 11/2016 | Kee Mew |
| 2016/0365653 A1 | 12/2016 | Takai et al. |
| 2017/0194731 A1 | 7/2017 | Van Rijswijk |
| 2017/0302031 A1 | 10/2017 | Cheng et al. |
| 2017/0352991 A1 | 12/2017 | Lin et al. |
| 2017/0367206 A1 | 12/2017 | Yang et al. |
| 2018/0076560 A1 | 3/2018 | Tang |
| 2018/0090864 A1 | 3/2018 | Niu et al. |
| 2018/0138612 A1 | 5/2018 | Lin et al. |
| 2018/0198220 A1 | 7/2018 | Sasame et al. |
| 2018/0212361 A1 | 7/2018 | Eppley et al. |
| 2018/0212362 A1 | 7/2018 | Wang et al. |
| 2019/0165518 A1 | 5/2019 | Hsu et al. |
| 2019/0199023 A1 | 6/2019 | Soh |
| 2020/0076131 A1 | 3/2020 | Hu et al. |
| 2020/0076135 A1 | 3/2020 | Tang et al. |
| 2020/0203867 A1 | 6/2020 | Lu |
| 2021/0288423 A1 | 9/2021 | Guo et al. |
| 2021/0351529 A1 | 11/2021 | Yang et al. |
| 2021/0376508 A1 | 12/2021 | Hu |
| 2022/0037828 A1 | 2/2022 | Hu et al. |
| 2022/0069496 A1 | 3/2022 | Yi et al. |
| 2022/0181809 A1 | 6/2022 | Xie et al. |
| 2022/0247107 A1 | 8/2022 | Tang et al. |
| 2023/0096092 A1 | 3/2023 | Hu |
| 2023/0126150 A1 | 4/2023 | Yang et al. |
| 2023/0163500 A1 | 5/2023 | Yang et al. |
| 2023/0178916 A1 | 6/2023 | Yang et al. |
| 2023/0238724 A1 | 7/2023 | Yang et al. |
| 2023/0335931 A1 | 10/2023 | He et al. |
| 2024/0014585 A1 | 1/2024 | Yang et al. |
| 2024/0014596 A1 | 1/2024 | Yang et al. |

FOREIGN PATENT DOCUMENTS

| | | |
|---|---|---|
| CN | 203660106 U | 6/2014 |
| CN | 105703103 A | 6/2016 |
| CN | 108539464 A | 9/2018 |
| CN | 212874843 U | 4/2021 |
| CN | 214505858 U | 10/2021 |
| EP | 0820124 A2 | 1/1998 |
| EP | 1207587 A2 | 5/2002 |
| GB | 227943 A | 1/1925 |
| JP | 2009-129682 | 6/2009 |
| TW | 200835073 A | 8/2008 |
| TW | M475740 U | 4/2014 |
| WO | WO 02/073819 A2 | 9/2002 |

OTHER PUBLICATIONS

International Search Report and Written Opinion mailed May 4, 2018 in connection with International Application No. PCT/US2018/014421.

International Preliminary Report on Patentability mailed Aug. 1, 2019 in connection with International Application No. PCT/US2018/014421.

[No Author Listed], DDR5 SDRAM—Wikipedia. Aug. 8, 2021. 6 pages. URL:https://en.wikipedia.org/wiki/DDR5_SDRAM [last accessed on Aug. 16, 2021].

[No Author Listed], DDR5 Memory Module Sockets (SMT). Storage & Server IO. Amphenol ICC. 2022. 2 pages. URL:https://cdn.amphenol-cs.com/media/wysiwyg/files/documentation/datasheet/ssio/ssio_ddr5_smt.pdf [last accessed Mar. 22, 2022].

[No Author Listed], MCIO 124pos 85ohm. Amphenol Assembletech. 1 page. URL:http://www.amphenol-ast.com/v3/en/overview.aspx?classId=234 [retrieved on Apr. 11, 2022].

[No Author Listed], Mini Cool Edge IO—The Ideal Solution to Transmit Next Generation High-Speed Signal to Designated Area in Your System. Jul. 25, 2018. 2 pages. URL:https://www.amphenol-icc.com/connect/mini-cool-edge-io-the-ideal-solution-to-transmit-next-generation-high-speedsignal.html [retrieved on Apr. 11, 2022].

[No Author Listed], Mini Cool Edge IO Connector. Commercial IO. Amphenol ICC. 2022. 5 pages. URL:https://cdn.amphenol-icc.com/media/wysiwyg/files/documentation/datasheet/inputoutput/io_mini_cool_edge_io.pdf [retrieved on Apr. 11, 2022].

Armasu, What We Know About DDR5 So Far. Jun. 7, 2019. 20 pages. URL:https://www.tomshardware.com/news/what-we-know-ddr5-ram,39079.html [last accessed Jul. 21, 2022].

U.S. Appl. No. 17/199,204, filed Mar. 11, 2021, Guo et al.
U.S. Appl. No. 17/331,414, filed May 26, 2021, Hu et al.
U.S. Appl. No. 17/386,252, filed Jul. 27, 2021, Hu et al.
U.S. Appl. No. 17/402,255, filed Aug. 13, 2021, Yi et al.
PCT/CN2021/114671, Nov. 29, 2021, International Search Report and Written Opinion.
PCT/US2018/014421, May 4, 2018, International Search Report and Written Opinion.
PCT/US2018/014421, Aug. 1, 2019, International Preliminary Report on Patentability.
U.S. Appl. No. 17/950,364, filed Sep. 22, 2022, Hu.
U.S. Appl. No. 17/973,913, filed Oct. 26, 2022, Yang et al.
U.S. Appl. No. 17/988,330, filed Nov. 16, 2022, Yang et al.
U.S. Appl. No. 18/075,246, filed Dec. 5, 2022, Yang et al.
U.S. Appl. No. 18/101,998, filed Jan. 26, 2023, Yang et al.
U.S. Appl. No. 18/133,601, filed Apr. 12, 2023, He et al.
U.S. Appl. No. 18/346,150, filed Jun. 30, 2023, Yang et al.
U.S. Appl. No. 18/346,155, filed Jun. 30, 2023, Yang et al.
U.S. Appl. No. 18/427,619, filed Jan. 30, 2024, Hu.
U.S. Appl. No. 18/453,448, filed Aug. 22, 2023, Yang et al.
U.S. Appl. No. 18/453,504, filed Aug. 22, 2023, Yang et al.
U.S. Appl. No. 18/505,468, filed Nov. 9, 2023, Yang et al.
[No Author Listed], Amphenol Information Communications and Commerical Products. Amphenol ICC Storage & Server IO. 2023, 10 pages. URL:https://cdn.amphenol-cs.com/media/wysiwyg/files/documentation/customerpresentation/ddr4_product_presentation.pdf [retrieved on Dec. 19, 2023].

Hu, Lead Assembly, Electrical Connector, Printed Circuit Board and Electronic System, U.S. Appl. No. 18/427,619, filed Jan. 30, 2024.

Yang et al., Card Edge Connector With Reduced Height, U.S. Appl. No. 18/453,448, filed Aug. 22, 2023.

Yang et al., Reliable Card Edge Connector with Narrow Latch, U.S. Appl. No. 18/346,155, filed Jun. 30, 2023.

Yang et al., Robust Electrical Connector, U.S. Appl. No. 18/505,468, filed Nov. 9, 2023.

Yang et al., Surface Mount Card Edge Connector and Compact Electronic System Therewith, U.S. Appl. No. 18/453,504, filed Aug. 22, 2023.

* cited by examiner

CARD EDGE CONNECTOR WITH A LOCKING SYSTEM

CROSS-REFERENCE TO RELATED APPLICATIONS

This application claims priority to Chinese Patent Application Serial No. 202011408724.1, filed on Dec. 4, 2020, entitled "CARD EDGE CONNECTOR WITH NEW LOCKING SYSTEM," which is hereby incorporated by reference in its entirety.

TECHNICAL FIELD

This patent application relates generally to interconnection systems, such as those including electrical connectors, used to interconnect electronic assemblies.

BACKGROUND

Many electronic systems include connectors to enable subassemblies to be manufactured separately and later assembled into a functioning system. Connectors also enable subassemblies to be added, removed, or replaced after the system has been initially manufactured. Connectors sometimes have a two-piece configuration, in which connectors are attached to two subassemblies within a device. The two connectors are mated to enable the subassemblies to interoperate as part of the system. In another configuration, connectors are attached to cables for connecting separate devices into a system. In a further configuration, referred to as a card edge connector, a connector may mate directly to a subassembly.

A card edge connector may be attached to a first printed circuit board in an electronic device. The first printed circuit board may be a "motherboard," for example, containing major components of a system or subassembly. The card edge connector may include a slot into which an edge of a second printed circuit board is inserted. The second printed circuit board may be smaller than the motherboard and may have components, such as memory components, attached to it.

The second printed circuit board may have contact pads on a surface near the edge. Contact elements within the slot of the connector press against these contact pads, forming electrical connections between the second printed circuit board and the connector. Those contact elements pass through the connector and extend from a mounting face of the connector where they are attached to the first printed circuit board. Inserting the second printed circuit board into the connector forms conducting paths through the connector between the second printed circuit board and the first printed circuit board. As the components on the second printed circuit board are connected through the printed circuit board to the contact pads, inserting the second printed circuit board into the connector enables those electronic components to work as part of a system with the components attached to the first printed circuit board.

Some card edge connectors include one or more alignment ribs that span the slot. The alignment ribs have defined relationships relative to the contact elements in the slot. Openings in the second printed circuit board, which are sized to receive the alignment ribs, have that same defined relationship to the contact pads on the cards. When the second printed circuit board is inserted into the slot, the alignment ribs enter the openings in the board, aligning the openings to the alignment ribs and, consequently, aligning the contact pads to the contact elements.

For some card edge connectors, the second printed circuit board is held in the connector by friction. Other card edge connectors have structures that lock the second printed circuit board in the connector. Locking a board in a connector ensures proper functioning of the electronic system by retaining the board in a position in which the contact pads are engaged with the contact elements. For example, a card edge connector may include latches at the edge of the slot. These latches can be pushed toward the sides of the second printed circuit board, inserting projections into cutouts in the side of the board. In some card edge connectors, latching members may be in other locations, such as is illustrated in U.S. Pat. No. 10,461,467.

BRIEF SUMMARY

Aspects of the present disclosure relate to a card edge connector with a locking system.

In one aspect, a card edge connector may include a housing comprising a slot shaped to receive an edge of a board, an array of contacts disposed along a wall of the slot, and a compliant locking member integrally formed with the housing between a first portion of the array of contacts and a second portion of the array of contacts. The locking member may include a protrusion, and may be deflectable between a first position in which the protrusion extends into a volume aligned with the slot and a second position in which the protrusion is outside the volume aligned with the slot.

In some embodiments, the housing may further comprise an alignment rib spanning the slot. The protrusion of the locking member may be located above the alignment rib.

In some embodiments, the locking member is centrally located between the first portion and second portion of the array of contacts.

In some embodiments, the protrusion comprises a first surface that is slanted downward toward the slot.

In some embodiments, the protrusion is circular over at least a portion of a perimeter of the protrusion.

In some embodiments, the at least a portion of the perimeter of the protrusion comprises an angular extent of at least 45 degrees.

In some embodiments, the at least a portion of the perimeter of the second opening comprises an angular extent of at least 90 degrees.

In some embodiments, the at least a portion of the perimeter of the second opening comprises an angular extent of at least 135 degrees.

In some embodiments, the at least a portion of the perimeter of the second opening comprises an angular extent of at least 180 degrees.

In some embodiments, the locking member further comprises an elongated arm connected at a first end to the housing and at a second end to the protrusion.

In some embodiments, the first end comprises a flexure attached to a wall of the housing.

In some embodiments, the flexure is a u-shape.

In some embodiments, the housing comprises walls bounding the slot. The locking member may extend above the walls.

In some embodiments, a portion of the housing adjacent the locking member may include a baffle that extends above the walls.

In some embodiments, the baffle may at least partially extend around the locking member.

In some embodiments, the baffle may extend around the locking member in a u-shape.

In another aspect, an electronic system may include a first board and a second board parallel to the first board, and a third board between the first board and the second board. The first board may include a first card edge connector mounted on a surface of the first board facing the second board, wherein the first card edge connector comprises a first slot and a first locking member centrally located along the first slot. The second board may include a second card edge connector mounted on a surface of the second board facing the first board, wherein the second card edge connector comprises a second slot and a second locking member centrally located along the second slot. A first end of the third board may be inserted into the first slot of the first card edge connector and a second, opposite end of the third board is inserted into the second slot of the second card edge connector. The first end of the third board may include a first hole aligned with the first locking member, wherein a protrusion on the first locking member may extend into the first hole locking the third board to the first card edge connector.

In some embodiments, the second end of the third board may include a second hole aligned with the second locking member. A protrusion on the second locking member may extend into the second hole locking the third board to the second card edge connector.

In some embodiments, at least a portion of the first hole or second hole may be circular.

In some embodiments, the locking member may be positioned in line with an alignment rib in the connector.

In another aspect, a method of operating a card edge connector may include connecting a first board to a second board by inserting a first end of the first board into a first slot in a card edge connector mounted on the second board, advancing the first board into the first slot until a first locking member integrally connected to the card edge connector of the second board latches a first hole centrally located along the first end of the first board, and further inserting the first board into the first slot while allowing the first board and the second board to pivot relative to each other about an axis through the first hole.

In some embodiments, the method may further include connecting the first board to a third board parallel to the second board by inserting a second end of the first board opposite the first end into a second slot in a card edge connector mounted on the third board; advancing the first board into the second slot until a second locking member integrally connected to the card edge connector of the third board latches a second hole centrally located along the second end of the first board; and further inserting the first board into the second slot while allowing the first board and the third board to pivot relative to each other about an axis through the second hole.

In some embodiments, advancing the first board into the second slot may include moving the second and third board toward each other in a parallel direction.

In some embodiments, allowing the first board and the second board to pivot relative to each other may include at least part of an inside surface of the first hole pivoting on a bearing surface of a protrusion on the first locking member.

In yet another aspect, a board is provided with a plurality of contact pads on a surface of the board adjacent a first edge, the board comprising a first opening through the surface that extends from the first edge and is elongated in a direction perpendicular to the first edge, and a second opening through the surface separate from the first opening and aligned with the first opening in the direction perpendicular to the first edge, wherein the second opening is located a greater distance from the first edge than the first opening, and is circular over at least a portion of a perimeter of the second opening.

In some embodiments, the at least a portion of the perimeter of the second opening may include an angular extent of at least 45 degrees.

In some embodiments, the at least a portion of the perimeter of the second opening may include an angular extent of at least 90 degrees.

In some embodiments, the at least a portion of the perimeter of the second opening may include an angular extent of at least 135 degrees.

In some embodiments, the at least a portion of the perimeter of the second opening may include an angular extent of at least 180 degrees.

In some embodiments, the second opening may have an aspect ratio between 1:1 and 1:2.

In some embodiments, a centerline of the second opening may be aligned with a centerline of the first opening.

In some embodiments, a width of the first elongated opening may be the same as a width of the smaller opening.

In some embodiments, the second opening may be located in a central region along the first edge.

In some embodiments, the board may further include a plurality of contact pads on a surface of the board adjacent a second edge; a third opening through the surface that extends from the second edge and is elongated in a direction perpendicular to the second edge; and a fourth opening through the surface separate from the third opening and aligned with the third opening in the direction perpendicular to the second edge, wherein the second opening is located a greater distance from the second edge than the third opening, and is circular over at least a portion of a perimeter of the fourth opening.

In some embodiments, the first, second, third, and fourth openings may be aligned in the same perpendicular line.

The foregoing aspects may be used separately or together, in a combination of two or more aspects. Features and advantages of the present disclosure are described in detail below with reference to the accompanying drawings.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
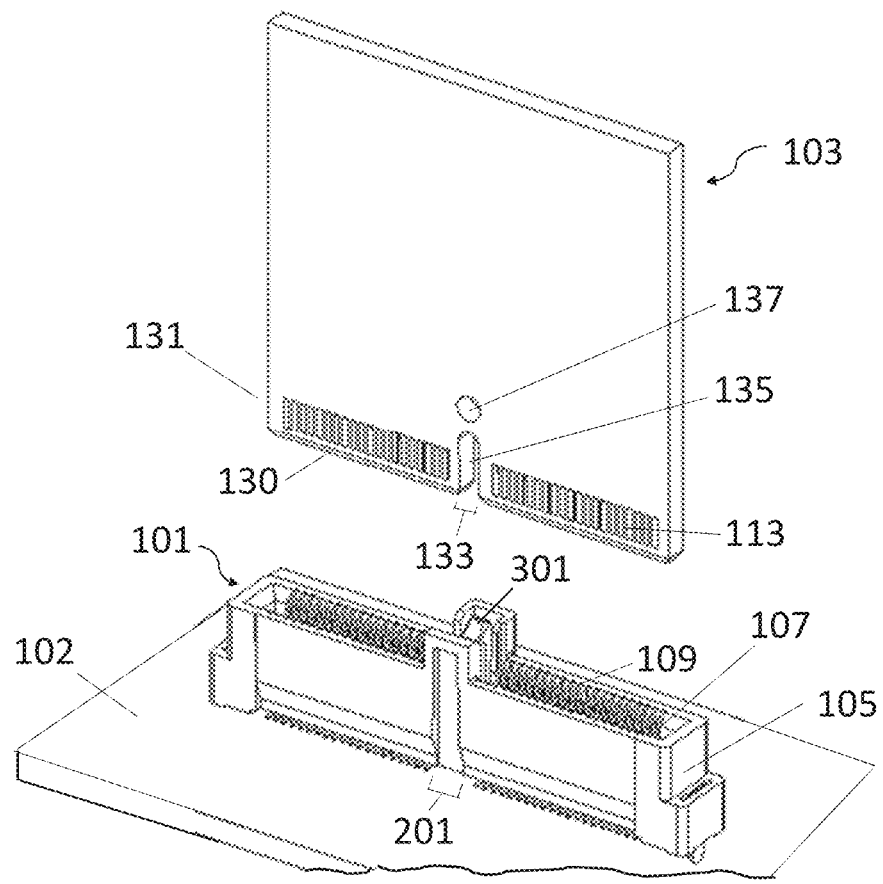
FIG. 1 is a front, perspective view of an exemplary embodiment of a connector mounted to a first board, with a second board positioned for mating with the connector.

The inventors have recognized and appreciated designs for a locking system of card edge connectors that enable simple and low-cost manufacture of the connector yet lead to compact connectors that support reliable operation in one or more electronic system configurations.

In accordance with some embodiments, the locking member may be integrally formed with the housing of the connector, making manufacturing of the connector efficient.

In some embodiments, a locking member may include a compliant member integrally formed with the walls of the housing of the connector, such as by molding the compliant member as part of the same operation in which the housing is formed. The compliant member may be deflectable in a direction perpendicular to the walls and may have a protrusion designed to fit into an opening of a printed circuit board. As a board is inserted into the slot, the board may push on the protrusion and temporarily deflect the locking member away from the slot. When the opening of the board aligns with the protrusion, the protrusion may spring back toward the slot and into the opening in the board, locking the board in the slot. To remove the board from the slot, a counterforce may be applied at the end of the locking member to deflect the locking member away from the slot and remove the protrusion from the opening in the board.

Furthermore, the inventors have recognized and appreciated that conventional latches for card edge connectors may inhibit desirable movement of a printed circuit board once it is locked in place. In some systems, for example, a first printed circuit board and a second printed circuit board parallel to the first printed circuit board may be connected through a third printed circuit board. The first board, for example, may be a mother board, and the second board may be a daughter board, and both may contain a card edge connector. The third board may be a riser board perpendicular to the first and second boards with opposite edges of the third board connected to the first and second boards through the card edge connectors mounted to each. In some system configurations, to enable either or both of the first or second boards to move, in a direction parallel to those boards, such that the boards may float relative to each other. When the firsts and second boards float the connectors on the first and third boards may be skewed with respect to each other. The inventors have recognized that this float is inhibited by conventional card edge connector latch designs that are designed to hold the third board perpendicular to the slots of the connectors on the first and second board. Latch designs as disclosed herein may allow the third board to pivot with respect to a card edge connector even after the board is locked in the connector and may lock, even if there is skew between the first and second boards. Such a locking system may enable float of the first and second printed circuit boards, but nonetheless ensure proper retention of the boards, preventing system failures.

In some embodiments, the protrusion of the locking member may have a partially rounded surface that corresponds with a rounded surface of the riser board opening. When the protrusion enters the opening in the riser board, the rounded surfaces may mate and create a bearing surface along which the riser board may pivot relative to the connector. This may allow the riser board to rotate to adjust for skew even after it is locked into the connector. Such a locking mechanism may be used with card edge connectors on either or both edges of a riser board to enable the first and second boards joined by the riser board to float relative to each other. Such a locking mechanism may also be used in other configurations in which it is desired to ensure reliable connections between a first board and another board through a card edge connector, even in scenarios in which the other board is tilted relative to the normal of the first board.

FIG. 1 shows a card edge connector 101 in accordance with some embodiments. In the embodiment illustrated, the connector 101 is configured to receive a board 103, shown aligned with but not inserted in slot 107 of connector 101.

In the illustrated embodiment, connector 101 comprises a housing 105 with slot 107 and an array of contacts 109 along the walls of the slot. The connector housing 105 may be made of insulative materials and the contacts may be made of compliant conductive materials, such as phosphor bronze or other copper alloys. Slot 107, and therefore the arrays of contacts 109, may be bisected by an alignment rib 111 (see FIG. 3). The alignment rib 111 extends at least partially across the housing slot 107 in a first direction, which is here shown as perpendicular to the elongated dimension of slot 107. In some embodiments, the alignment rib may fully extend across the housing slot 107.

Alignment rib 111 may be positioned in a portion 201 of connector 101 that is free of contacts 109. Such a portion, in addition to guiding a board 103 into slot 107 may provide mechanical support to the connector. In some embodiments, portion 201 may include a locking member as described below, enabling integration of a locking member in an area of an electronic assembly that might otherwise be unoccupied by electric components.

Slot 107 is shaped to receive an edge of a board 103 such that contact pads 113 on the board 103 mate with contacts 109 when the board 103 is inserted in slot 107. Board 103 may be a riser board that has traces to make connections between board 102 to another board or may be a printed circuit board with any one or more electronic components. In some embodiments those components may comprise computer memory chips. In some embodiments, the board may be a memory module, such as a DDR4 memory with one or more semiconductor chips attached to or embedded in a substrate according to known manufacturing techniques.

The board 103 may have contact pads 113 on a surface making electrical connections to the traces and/or electronic components of the board. The contact pads 113 may be positioned in a pattern with a pitch, which may match the pattern and pitch of contacts within connector 101. In the embodiment illustrated, contact pads 113 extend from the front edge 130 of the board 103. All of the contact pads 113 may have the same shape and size. However, one or more contact pads may have different shapes and sizes. In some embodiments, the contact pads 113 have a rectangular shape and are arranged parallel to one another, although other configurations are possible. In the embodiment illustrated, the contact pads 113 have a width that is narrow relative to the length.

The plurality of contact pads 113 is bisected into a first group and a second group of contact pads by a first opening 135. In some embodiments the first opening 135 may comprise an elongated first opening on a surface of the board 103 adjacent a forward edge 130. The first opening 135 may extend to the forward edge, providing an opening in the forward edge 130. From the forward edge, the elongated first opening 135 may extend through the board in a direction perpendicular to the surface and extend perpendicularly to the forward edge 130.

The first opening 135 may aid in positioning board 103 within slot 107 of connector 101. In some embodiments, the first opening 135 may be shaped and positioned to align with an alignment rib 111 of the connector 101. In the embodiment of FIG. 1, the alignment rib 111 partially extends across the slot 107 of connector 101. As illustrated by the example embodiment of FIG. 1, the first opening 135 may be located in a central region 133 of a forward portion 131 of the board 103 and may extend at least 4 mm from the forward edge 130. The mouth of the first opening 135 may be tapered, facilitating alignment of the first opening 135 with the alignment rib 111 upon insertion of the board 103 into the slot 107.

In accordance with some embodiments, the contacts 109 within connector 101 may be spaced in a predetermined pattern relative to the alignment rib 111. Contact pads 113, configured for mating with the contacts 109 of the connector 101, may have this same predetermined pattern relative to the first opening 135. This pattern may be set by a standard, for example a DDR4 standard, or may alternatively or additionally be set by the designer of the board 103 or connector 101. The contacts 109 may be aligned parallel to one another and are shaped and sized to mate with the contact pads 113. In some embodiments, the first opening 135 may bisect the contact pads 113 into a first group and a second group of contact pads.

Board 103 also has a second opening 137 which may also extend through the board 103 in a direction perpendicular to the surface. The second opening 137 may have the same width or different width than the first opening 135. The second opening 137 may be separate from the first opening. In accordance with some embodiments, the first opening 135 may have a first width and the second opening 137 may have a second width. For example, the first width may be between 0.5 mm and 5 mm, and the second width may be between 1 mm and 10 mm.

In accordance with some embodiments, the second opening 137 may be circular. In other embodiments, the second opening may not be entirely round, but only a portion of the perimeter may be circular. A circular portion of the perimeter of the second opening may have an angular extent of at least 45, 90, 135, or 180 degrees.

The second opening 137 may be shaped and positioned to facilitate locking the board 103 in connector 101. In the embodiment illustrated, connector 101 includes a locking member 301. Locking member 301 may be connected to the housing 105 of connector 101 adjacent slot 107. In some embodiments, the locking member 301 may be connected to the housing 105 between a first portion of the array of contact 109 and a second portion of the array of contacts where the first portion and the second portion of the array of contacts correspond to the first and second group of contact pads of the board 103. In some embodiments, the locking member 301 may be centrally located along the slot. The locking member 301 may be aligned with the alignment rib 111.

Figure 2:
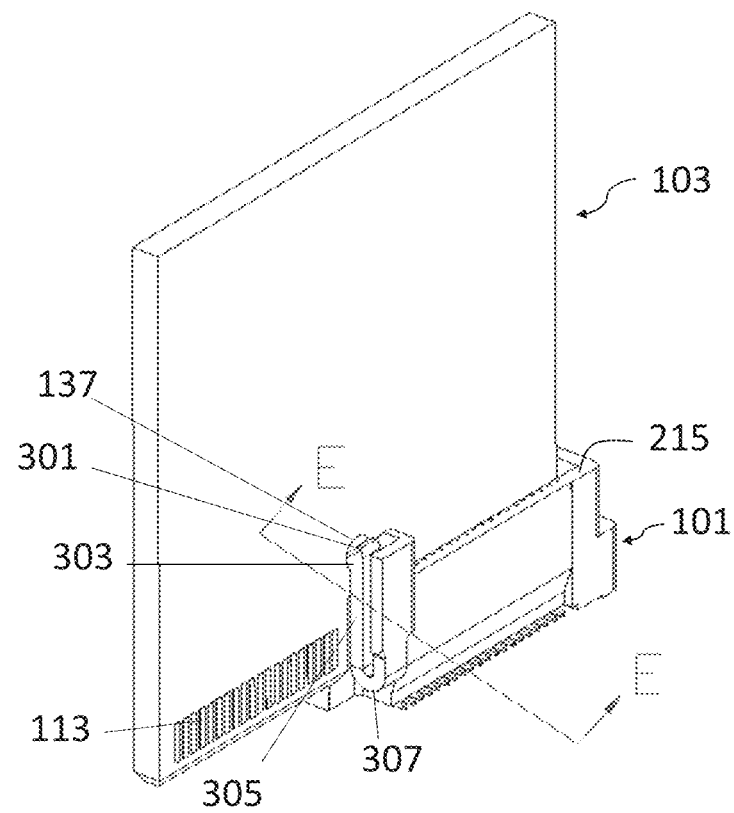
FIG. 2 is a rear, perspective view of the connector of FIG. 1, partially cutaway, with the second board mated with the connector.

FIG. 2 shows the board 103 locked into the connector 101 in one embodiment. A portion of connector 101 is shown cut away in FIG. 2. The locking member 301 may engage with the second opening 137 to lock the board 103 to the connector 101. The contact pads 113 of the board 103 may mate with the contacts 109 of the connector to form an electrical connection between the board 103 and a motherboard on which the connector is attached to create an electrical system. Locking the board may create a secure electrical connection between the boards.

In the illustrated embodiment, the locking member 301 may have a first end 307 that is rigidly connected to one of the walls 215, 216 of the housing 105. In some embodiments, the first end 307 may include a flexure that is integrally formed with the wall 215. The locking member may include an elongated arm 305 that extends from the first end 307 and may form a u-shape with the wall 215 of the housing 105.

In some embodiments, the locking member 301 may extend above the walls 215, 216 of the housing 105. The locking member 301 may have one or more protrusions 303 shaped to fit within second opening 137 of the board 103. In the illustrated embodiment, the protrusion 303 engages the second opening 137 above the walls 215, 216 of the housing. The locking member 301 may be a compliant locking member such that the protrusion 303 deflects in a direction perpendicular to the walls 215, 216. In other embodiments the locking member may be rigidly coupled to the wall 215 and spring loaded to urge the protrusion toward the slot.

Figure 3:
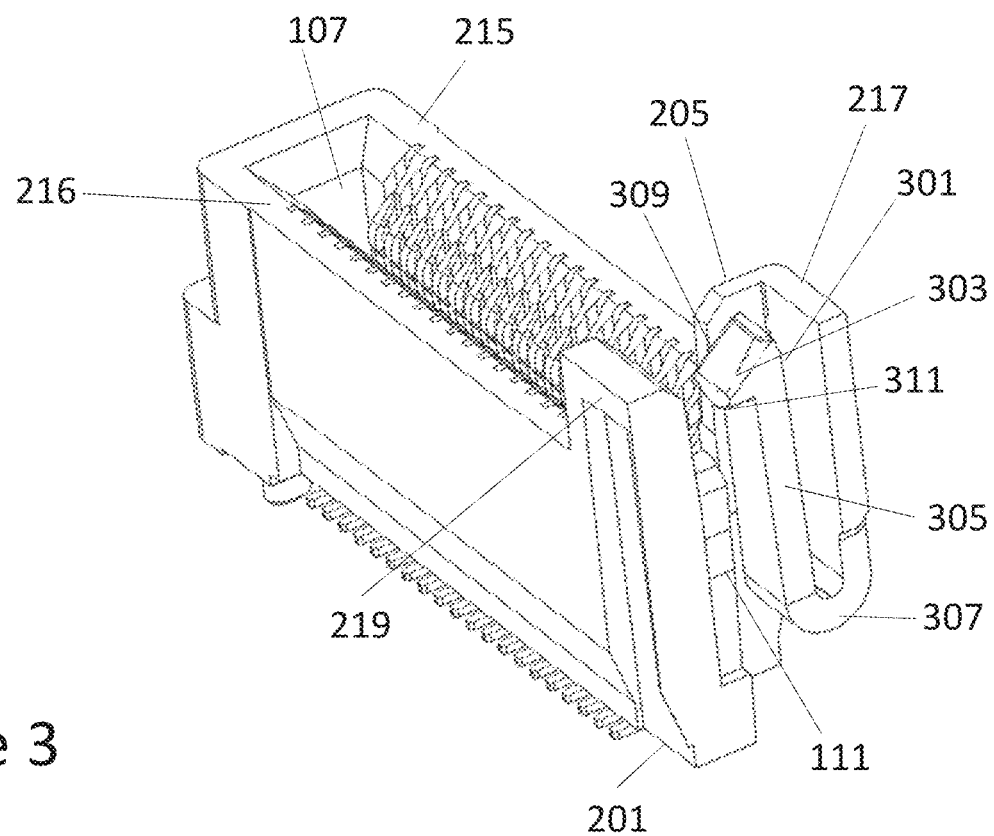
FIG. 3 is a right side perspective view of the connector of FIG. 2, partially cut away, without the second board.

In the embodiment illustrated in FIG. 3, the walls 215, 216 of the housing 105 may have one or more projections 217, 219 aligned with the locking member 301 and that extend above the height of the walls 215, 216. In the illustrated embodiment, one such projection may form a baffle 217, which may be formed in the wall 215 behind the locking member 301 and may partially surround the locking member. The baffle 217 may be the same or different height as the locking member 301. For example, baffle 217 may be taller than locking member 301. Baffle 217 may have sides 205 so that it extends outward from wall 215. In the illustrated embodiment, a portion of the sides 205 are integrally connected to wall 215 of the housing. The baffle 217 may wrap around the locking member 301 in a u-shape. The u-shape may have squared, angled, or rounded corners. The sides 205 may have a beveled top surface to facilitate insertion of the board 103 and help guide the board into the slot 107.

In the illustrated embodiment, the first end 307 of the locking member 301 may be integrally connected to the bottom portion of the baffle 217. The first end 307 may be a flexure connecting the baffle 217 and the locking member 301 in a u-shape. The flexure may be compliant such that the locking member may deflect in a direction perpendicular to the slot 107. When there are no forces acting on the locking member 301, the protrusion 303 may be positioned within a volume aligned with the slot 107.

In the illustrated embodiment, another projection 219 may be formed on the wall 216 opposite baffle 217, facing the protrusion 303 of the locking member 301. The projection 219 may be the same or different height as the locking member 301 and may, for example be configured to extend to a height equal to or greater than locking member 301 and/or the second opening 137 when a board is inserted into connector 101. Projection 219 may be located adjacent to alignment rib 111. The projection 219 and the alignment rib 111 may be integrally formed. The projection 219 may have a beveled top surface to facilitate insertion of the board 103 and help guide the board into the slot 107. In some embodiments, not shown, the locking member 301 may be connected to the alignment rib 111. For example, the locking member and the alignment rib may form a u-shape that wraps under the board 103 or through the first opening 135 when the board is inserted into slot 107.

Projection 219 and baffle 217 may cooperate to prevent damage to locking member 301 and/or unintended unlocking of a board when engaged by locking member 301. A rear wall of baffle 217 may be spaced sufficiently far from slot 107 that locking member 301 may flex away from slot 107 a sufficient distance to enable a board to be inserted into the slot.

Figure 4:
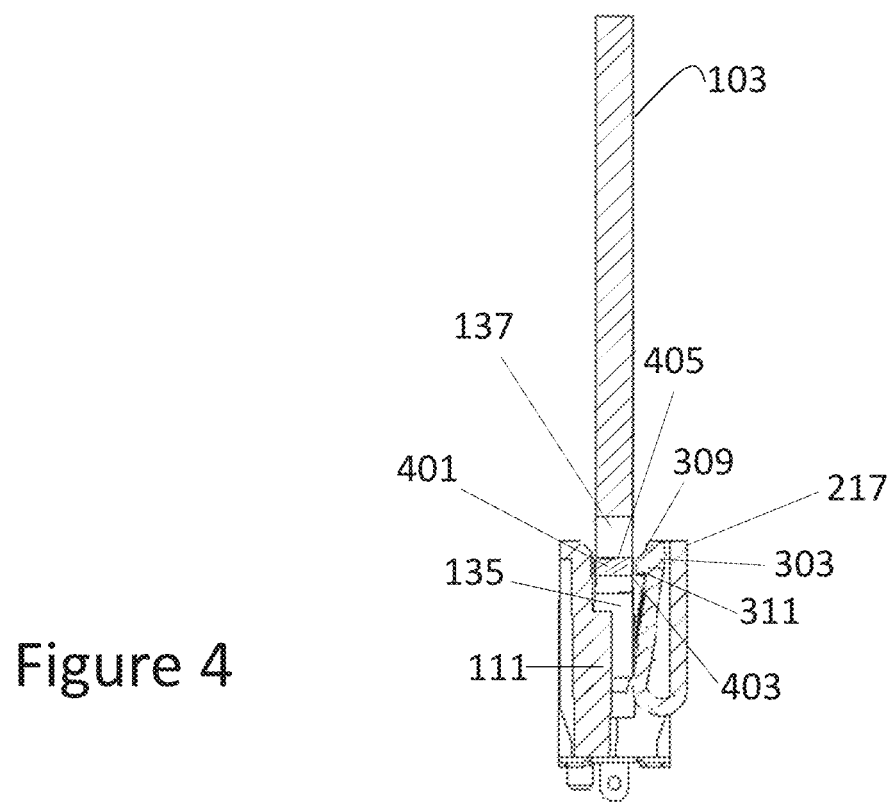
FIG. 4 is a cross section through the line E-E (FIG. 2) of the connector of FIG. 1 with the second board partially inserted into the connector.

In the embodiment illustrated, the protrusion 303 of the locking member may have a slanted top surface 309 which may facilitate insertion of the board 103 and guide the board 103 into the slot 107. The slanted top surface 309 may also act as a camming surface. When a board 103 is inserted into slot 107, a portion of the board may contact the slanted top surface 309 of the protrusion and exert a force to deflect the locking member away from the slot, as shown in FIG. 4. The board 103 may have a corresponding ledge 401 aligned with the protrusion 303 of the locking member 301. Ledge 401 may be a portion of the board 103 between the first opening 135 and the second opening 137.

When a board 103 is inserted into slot 107, the top slanted surface 309 of the locking member may contact the lower surface 403 of ledge 401. In the illustrated embodiment, the lower surface 403 may be a portion of the upper surface of first opening 135. Surface 403 may have a beveled edge where it contacts the slanted surface 309 of the projection. As the board 103 is inserted, the edge of the lower surface 403 slides against the slanted surface 309 of locking member 301. This may exert a force on slanted surface 309 and deflect the second end of locking member 301 perpendicularly away from slot 107. As the ledge 401 passes by the protrusion 303 as the board 103 is being inserted, ledge 401 pushes the protrusion 303 out of the volume aligned with the slot 107, which is now occupied by the board 103. As the board 103 is further inserted and the ledge 401 completely passes by the protrusion 303, the locking member 301 may spring back toward the slot and the protrusion 303 may enter second opening 137, locking the board 103 in the connector 101.

Figure 5:
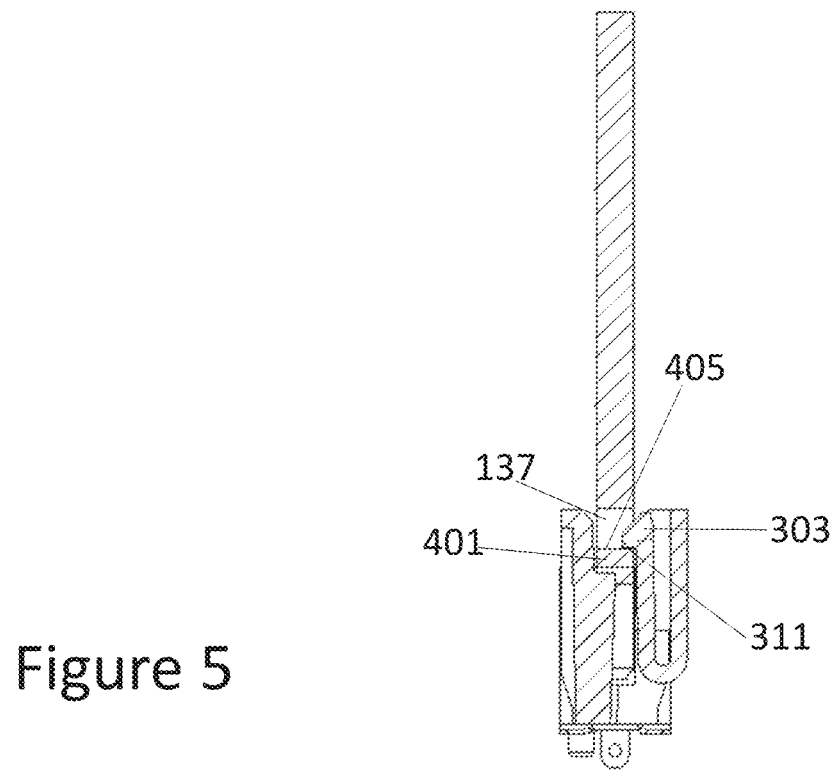
FIG. 5 is a cross section through the line E-E (FIG. 2) of the connector of FIG. 1 with the second board locked into the connector.

FIG. 5 shows locking member 301 in the locked position. In this position, the array of contacts 109 on connector 101 may be mated with the contact pads 113 on board 103 and the board 103 may be fully inserted into the housing 105. The board may be fixed in place by the locking system. The protrusion 303 is within a volume aligned with the slot 107 such that it is inserted into the second opening 137. A bottom surface 311 of protrusion 303 may latch onto an upper surface 405 of ledge 401. In the illustrated embodiment, the upper surface 405 may be a portion of the inside surface of the second opening 137. The protrusion 303 secures the board 103 from being inadvertently pulled from the slot. The board 103 may not be removed until a counterforce is exerted on the locking member to deflect the locking member 301 away from the board 103 and remove the protrusion 303 from the second opening 137.

Figure 6:
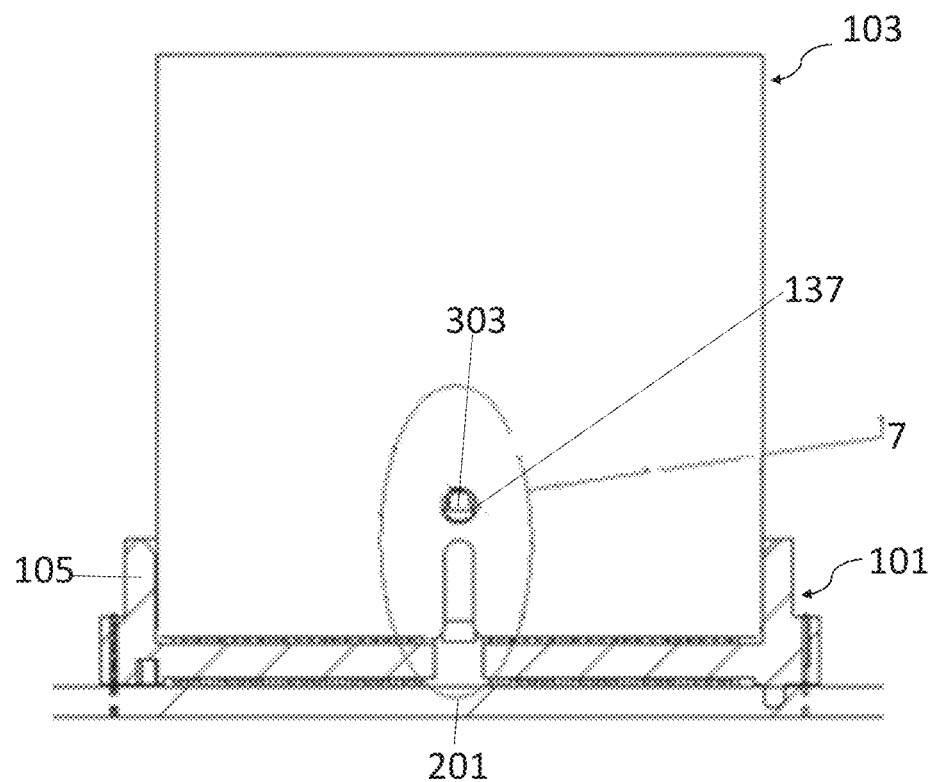
FIG. 6 is a front plan view of the connector of FIG. 1 partially cutaway, with the second board locked into the connector.
Figure 7:
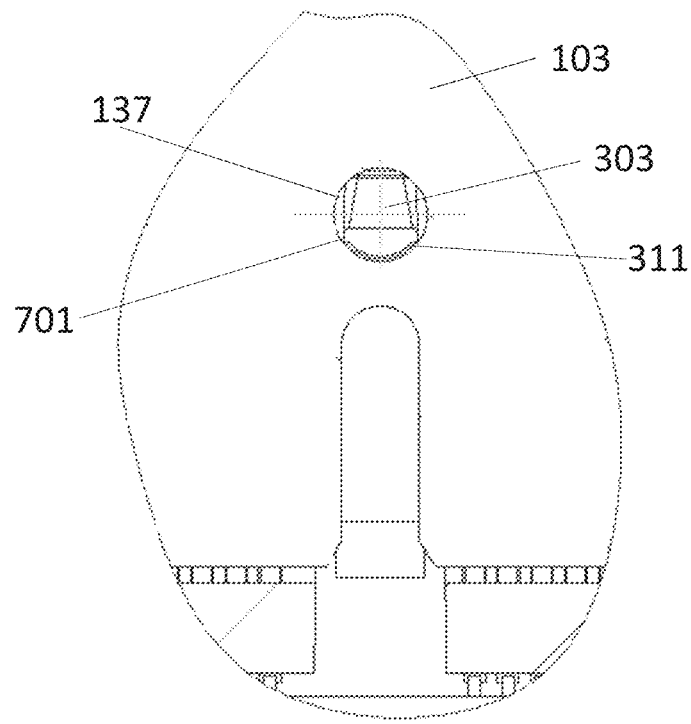
FIG. 7 is an enlarged view of the region 7 in FIG. 6.

FIGS. 6 and 7 show the board 103 locked into the connector 101. In the illustrated embodiment, the protrusion 303 may have a perimeter with a rounded portion. In this example, protrusion 303 has a rounded bottom surface 311. In some embodiments, the rounded bottom surface 311 may have an angular extent of at least 45, 90, 135, or 180 degrees, for example. The rounded surface 311 of the protrusion latches onto a corresponding rounded inside surface 701 of second opening 137. The rounded inside surface 701 may extend fully around opening 137 or over only a portion of the opening, such that the rounded inside surface has an angular extent of at least 45, 90, 135, or 180 degrees. When the locking member 301 is latched to the board 103, the rounded surfaces, such as rounded bottom surface 311 and rounded inside surface 701, may form a bearing surface along which the board 103 may rotate about an axis through the second opening 137. The board 103 may pivot relative to the connector 101 when the protrusion 303 is latched into the second opening 137. The connector 101 may lock the board 103 in place even when the board is inserted at an angle. Once the board 103 is locked in the connector 101, the board may still pivot to adjust for misalignment between the board and the connector. The forward edge of board 103, for example, may be angled relative to the direction of slot 107. Nonetheless, board 103 may be securely held in connector 101.

Figure 8:
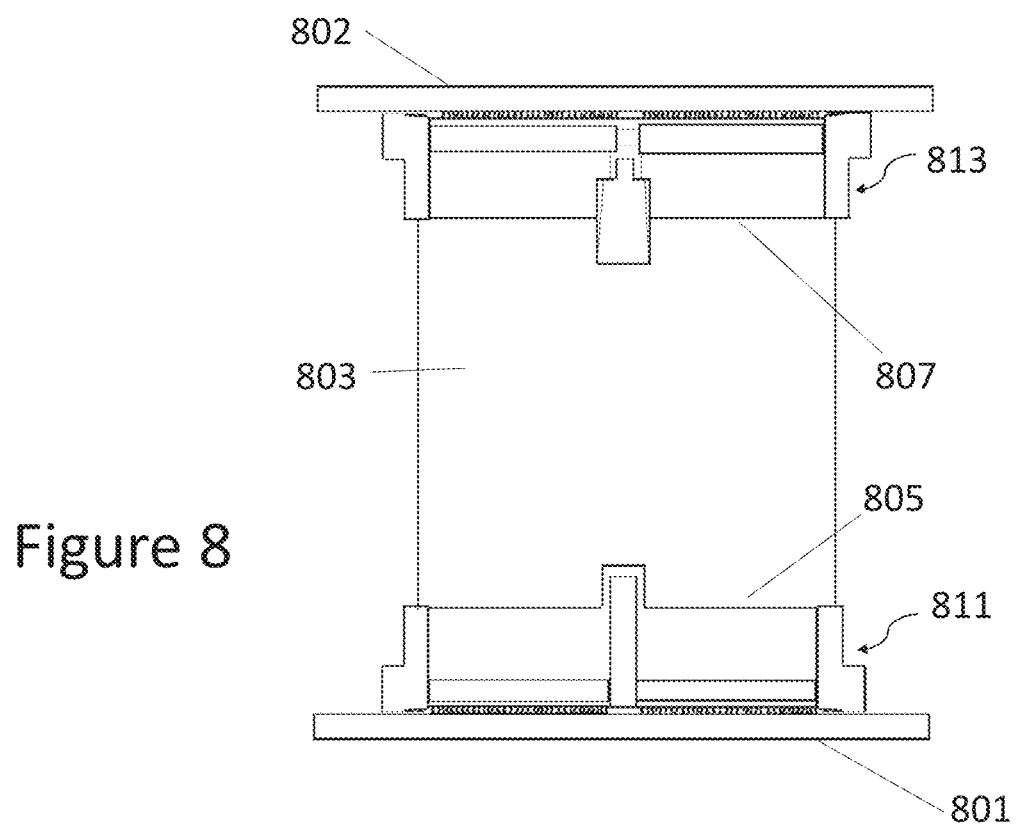
FIG. 8 is a sketch of a system in which a parallel first and second board, each including a connector as illustrated in FIG. 1 are joined via a riser board mated to those connectors.

A secure connection, even with a board angled with respect to the connector, may be desirable, for example, in which connectors, such as connector 101, are used to connect two parallel boards through a riser board. In the embodiment illustrated in FIG. 8, the electrical system 800 includes a third board, which may serve as a riser board connecting a first and second parallel board. In the illustrated embodiment, the first circuit board is a motherboard 801, the second printed circuit board is a daughterboard 802, and the third printed circuit board is a riser board 803. The motherboard 801 and the daughterboard 802 may be parallel to each other and each have a connector 811, 813 mounted on a surface for connecting riser board 803 perpendicularly between them. Riser board 803 may include a first end 805 and a second end 807. Each end may have one or more openings, such as first opening 135 and/or second opening 137, and may include conductive pads along an edge, as shown in FIG. 1. The connectors and boards include the same electrical and locking components as described above for forming secure electrical connections between the boards. For example, each of connectors 811 and 813 may be configured like connector 101, as described above.

The motherboard 801 and daughterboard 802 may float relative to each other such that connectors 811 and 813 will not always be aligned in the direction perpendicular to the surfaces of motherboard 801 and daughterboard 802, creating skew in the system 800. Incorporating the locking member 301 of FIGS. 6-7 may allow the riser board 803 to rotate in the connectors 811, 813 relative to the motherboard 801 and daughterboard 802 to adjust for any skew within the system 800 even once the riser board 803 is locked in place.

To assemble system 800, a first edge 805 of riser board 803 may be inserted into the connector 811 on the motherboard 801. As described above, a locking member of connector 811 may lock the riser board 803 into the connector 811 when a protrusion on the locking member latches a second opening at the first end 805 of riser board 803. The locking member may lock the riser board 803 to the connector 811 even though riser board 803 may be angled relative to the connector 811.

To connect the daughterboard 802 to system 800, a second end 807 of riser board 803 may be connected to the connector 813 on the daughterboard 802. In the illustrated embodiment, the motherboard 801 and daughterboard 802 may be parallel to each other and the first end 805 is opposite the second end 807 of the riser board 803. The daughterboard 802 may float relative to the motherboard 801 and the boards may not be perfectly parallel during assembly. If the daughterboard is skewed relative to the motherboard, the locking member may allow riser board 803 to rotate to align perpendicularly with the daughterboard 802 to insert riser board 803 into the connector 813. The locking member of connector 813 may latch an opening in riser board 803 even if the boards are skewed. The locking member of each connector 811, 813 may also allow the motherboard 801 and daughterboard 802 to rotate after locking to adjust for skew.

Although assembly of the system is described as connecting the motherboard 801 to the riser board 803 prior to connecting the daughterboard 801, the motherboard 801 and the daughterboard 802 may be connected to the riser board 803 simultaneously or the daughterboard 802 may be connected before the motherboard 802. One connector or both connectors 811, 813 may have a locking member that allows the riser board 803 to rotate relative to the connector once it is locked in place.

Having thus described several embodiments, it is to be appreciated various alterations, modifications, and improvements may readily occur to those skilled in the art. Such alterations, modifications, and improvements are intended to be within the spirit and scope of the invention. Accordingly, the foregoing description and drawings are by way of example only.

Various changes may be made to the illustrative structures shown and described herein. As a specific example of a possible variation, a card edge connector is described as mounted to a motherboard. In other system configurations, connectors as disclosed herein may be mounted to backplanes or other printed circuit boards.

As another example, a connector is shown mounted to a first board and configured to receive a second board that is orthogonal to the first board. In other configurations, the connector may receive a second board with another orientation, such as parallel to the first board.

As an example of another variation, contact tails were illustrated configured for surface mount soldering. In other configurations, the contact tails may be configured as press fit "eye of the needle" compliant sections that are designed to fit within vias of printed circuit boards. Other configurations may also be used, such as solderable pins, etc., as aspects of the present disclosure are not limited to the use of any particular mechanism for attaching connectors to printed circuit boards.

The present disclosure is not limited to the details of construction or the arrangements of components set forth in the foregoing description and/or the drawings. Various embodiments are provided solely for purposes of illustration, and the concepts described herein are capable of being practiced or carried out in other ways. Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or as additional item.

What is claimed is:

1. A card edge connector, comprising:
a housing comprising a slot shaped to receive an edge of a board;
an array of contacts disposed along a wall of the slot; and
a compliant locking member integrally formed with the housing between a first portion of the array of contacts and a second portion of the array of contacts, wherein:
the compliant locking member comprises a protrusion and is deflectable between a first position in which the protrusion extends into a volume aligned with the slot and a second position in which the protrusion is outside of the volume aligned with the slot,
the compliant locking member comprises a first end and a second end,
the protrusion is disposed at the second end of the compliant locking member,
the first end of the compliant locking member is connected to the housing via a flexure, and
the flexure extends in a first direction from the housing and curves such that the second end of the compliant locking member extends, in a second direction opposite the first direction, into the housing.

2. The card edge connector of claim 1, wherein:
the housing further comprises an alignment rib spanning the slot; and
the protrusion of the locking member is located above the alignment rib.

3. The card edge connector of claim 1, wherein the locking member is centrally located between the first portion and second portion of the array of contacts.

4. The card edge connector of claim 1, wherein:
the protrusion comprises a first surface that is slanted downward toward the slot.

5. The card edge connector of claim 1, wherein the protrusion is circular over at least a portion of a perimeter of the protrusion.

6. The card edge connector of claim 5, wherein the at least a portion of the perimeter of the protrusion comprises an angular extent of at least 45 degrees.

7. The card edge connector of claim 1, wherein:
the housing comprises walls bounding the slot; and
the locking member extends above the walls.

8. The card edge connector of claim 7, wherein a portion of the housing adjacent the locking member comprises a baffle that extends above the walls.

9. The card edge connector of claim 8, wherein the baffle at least partially extends around the locking member.

10. The card edge connector of claim 8, wherein the flexure is integrally connected to a bottom portion of the baffle.

11. An electronic system, the system comprising:
a first board and a second board parallel to the first board,
the first board comprising a first card edge connector mounted on a surface of the first board facing the second board, wherein the first card edge connector comprises a first slot, an alignment rib, and a first locking member centrally located along the first slot,
the second board comprising a second card edge connector mounted on a surface of the second board facing the first board, wherein the second card edge connector comprises a second slot and a second locking member centrally located along the second slot; and
a third board between the first board and the second board, wherein a first end of the third board is inserted into the first slot of the first card edge connector and a second, opposite end of the third board is inserted into the second slot of the second card edge connector,
the first end of the third board comprises a first hole aligned with the first locking member and an opening aligned with the alignment rib and, wherein a bottom portion of a perimeter of the first hole is circular and has a continuous angular extent of greater than 90 degrees, wherein a protrusion on the first locking member extends into the first hole locking the third board to the first card edge connector, wherein the protrusion comprises a rounded surface corresponding to the circular portion of the perimeter of the first hole, and wherein the bottom portion of the perimeter of the first hole is opposite a top of the opening aligned with the alignment rib.

12. The electronic system of claim 11, wherein the second end of the third board comprises a second hole aligned with the second locking member, wherein a protrusion on the second locking member extends into the second hole locking the third board to the second card edge connector.

13. The system of claim 12, wherein at least a portion of the second hole is circular.

14. The system of claim 11, wherein the locking member is positioned in line with the alignment rib in the connector.

15. A board comprising:
a first surface and a second surface opposite the first surface;
a first edge joining the first surface and the second surface;
a plurality of contact pads on the first surface and the second surface of the board adjacent the first edge;
a first opening through the first surface, wherein the first opening extends from the first edge and is centrally located along the first edge and elongated in a direction perpendicular to the first edge; and
a second opening through the first surface separate from the first opening and aligned with the first opening in the direction perpendicular to the first edge, wherein the second opening is located a greater distance from the first edge than the first opening, and is circular over at least a portion of a perimeter of the second opening, wherein the perimeter of the second opening is closed, and wherein a portion of the first surface of the board separates the first opening from the second opening, and wherein:
contact pads of the plurality of contact pads on the first surface of the board are configured to contact a first row of contacts of a card edge connector and contact pads of the plurality of contact pads on the second surface of the board are configured to contact a second row of contacts of the card edge connector when the board is mated with the card edge connector.

16. The board of claim 15, wherein the at least a portion of the perimeter of the second opening is circular over a continuous angular extent of at least 45 degrees.

17. The board of claim 15, wherein the second opening has an aspect ratio between 1:1 and 1:2.

18. The board of claim 15, wherein a centerline of the second opening is aligned with a centerline of the first opening.

19. The board of claim 15, wherein the second opening is located in a central region along the first edge.

* * * * *